(12) United States Patent
Smirnov et al.

(10) Patent No.: US 7,977,252 B2
(45) Date of Patent: Jul. 12, 2011

(54) METHOD OF FORMATION OF COHERENT WAVY NANOSTRUCTURES (VARIANTS)

(75) Inventors: Valery K. Smirnov, Yaroslavl (RU); Dmitry S. Kibalov, Yaroslavl (RU)

(73) Assignee: Wostec, Inc., San Francisco, CA (US)

( * ) Notice: Subject to any disclaimer, the term of this patent is extended or adjusted under 35 U.S.C. 154(b) by 1513 days.

(21) Appl. No.: 11/385,355

(22) Filed: Mar. 21, 2006

(65) Prior Publication Data

US 2008/0119034 A1 May 22, 2008

Related U.S. Application Data

(63) Continuation of application No. PCT/RU2004/000396, filed on Oct. 8, 2004.

(30) Foreign Application Priority Data

Oct. 10, 2003 (RU) ................. 2003129927

(51) Int. Cl.
*H01L 21/31* (2006.01)
(52) U.S. Cl. ........ 438/758; 438/760; 438/762; 438/763; 438/765; 438/766; 257/E21.332
(58) Field of Classification Search ............... 438/760, 438/762, 765, 771
See application file for complete search history.

(56) References Cited

U.S. PATENT DOCUMENTS 5,530,272 A * 6/1996 Kudo et al. ................. 257/192

FOREIGN PATENT DOCUMENTS

| RU | 2 173 003 | 8/2001 |
| RU | 2 180 885 | 3/2002 |
| RU | 2 240 280 | 11/2004 |

OTHER PUBLICATIONS

Karen, A. et al. (1995) "Quantitative Investigation of the $O_2^+$-Induced Topography of GaAs and Other III-V Semiconductors: an STM Study of the Ripple Formation and Suppression of the Secondary Ion Yield Change by Sample Rotation," *Surface and Interface Analysis*, vol. 23, pp. 506-513.

Vajo, J.J. et al. (1996) "Influence of $O_2^+$ Energy, Flux, and Fluence on the Formation and Growth of Sputtering-Induced Ripple Topography on Silicon," *J. Vac. Sci. Technol. A*, 14(5):2709-2720.

Scott, K.L. et al. (2000) "Pattern Generators and Microcolumns for Ion Beam Lithography," *J. Vac. Sci. Technol. B*, 18(6):3172-3176.

* cited by examiner

*Primary Examiner* — N Drew Richards
*Assistant Examiner* — Kyoung Lee
(74) *Attorney, Agent, or Firm* — Frommer Lawrence & Haug LLP; Bruce E. Black

(57) ABSTRACT

The method for forming wavelike coherent nanostructures by irradiating a surface of a material by a homogeneous flow of ions is disclosed. The rate of coherency is increased by applying preliminary preprocessing steps.

40 Claims, 10 Drawing Sheets

METHOD OF FORMATION OF COHERENT WAVY NANOSTRUCTURES (VARIANTS)

CROSS-REFERENCE TO RELATED APPLICATIONS

This present application is a continuation of PCT/RU2004/000396, filed Oct. 8, 2004, and which claims the benefit of Russian application No. 2003129927, filed Oct. 10, 2003, all of which are hereby incorporated by reference in their entirety.

FIELD OF THE INVENTION

The invention relates to methods and devices for forming wavy (wavelike) patterns with a period of about 100 nm or less on the surface of materials using ion fluxes and devices for surface polishing.

BACKGROUND OF THE INVENTION

A large variety of applications in semiconductor and optoelectronics industries can benefit from development of efficient methods for forming wavelike patterns on the surface of semiconductor materials. While different applications require different degrees of coherency, the structures with higher coherency and smaller feature size are usually associated with higher performance.

A method for forming wavelike patterns upon silicon surface as a nanostructure was disclosed in Russian Patent Application RU 99124768. In this method, silicon is sputtered with a homogeneous ion flux (flow) of molecular nitrogen $N_2^+$ until a periodic wavelike nanostructure with the nanostructure wave crests orientated perpendicular to a plane of ion incidence is formed.

First, a set of parameters, defining the geometry of an emerging wavelike nanostructure and the sputtering depths $D_m$ and $D_F$, corresponding to the commencement and completion of the growth of nanostructure wave amplitude, is selected. This set of parameters includes ion energy, an angle of ion incidence upon the silicon surface, silicon temperature, and a depth of ion penetration into the silicon. All these parameters are selected based upon a wavelength of the nanostructure. The method uses a $N_2^+$-Si system to form a wavelike nanostructure.

It is also known that gallium arsenide sputtered with $O_2^+$ ions ($O_2^+$-GaAs system) leads to formation of a wavelike nanostructure (Karen A., Nakagawa Y., Hatada M., Okino K., Soeda F., Ishitani A. Quantitave Investigation of the $O_2^+$-Induced Topography of GaAs and other III-V Semiconductors: an STM Study of the Ripple Formation and Suppression of the Secondary Ion Yield Change by Sample Rotation.—Surf. and Interf. Anal., 1995, v. 23, p. 506-513). A useful property of the said nanostructure is a sufficiently high aspect ratio (i.e. the ratio of wave amplitude to wavelength or a wave period). However, the degree of coherency and planarity of wavelike nanostructures being formed in the $O_2^+$-GaAs system is low.

It is also known that sputtering of silicon with a flux of molecular oxygen ions ($O_2^+$-Si system) leads to a formation of a wavelike pattern structure (Vajo J. J., Doty R. E., Cirlin E. H. Influence of $O_2^+$ energy, flux and fluency on the formation and growth of sputtering-induced ripple topography on silicon.—J. Vac. Sci. Technol. A, 1996, v. 14, No 5, p. 2709-2720).

Using scanning electron microscopy (SEM) the inventors have learned that at a certain depth of the silicon sputtering $D_m$ corresponding to the commencement of an intensive growth of amplitude of a wavelike pattern structure a low-amplitude structure pattern is formed in the $O_2^+$-Si system. These early-stage structures exhibit higher coherency and larger uninterrupted length of the wave structures as compared with the $N_2^+$-Si system. However, continued sputtering with oxygen ions in the $O_2^+$-Si system, while increasing amplitude of the waves, results in a considerable deterioration of coherency and planarity of the structure. On the contrary, a wavelike pattern structure formed in $N2^+$-Si is notable for a high degree of planarity extending to the sputtering depths equal to $3*D_F$.

A prior art system having a plasma electrode with a matrix of apertures for forming an ion beam matrix out of general plasma was described in a U.S. Pat. No. 6,486,480 and a paper (K. L. Scott, T. -J. King, M. A. Lieberman, K. -N. Leung "Pattern generators and microcolumns for ion lithography"—Journal of Vacuum Science and Technology B, v. 18 (6), 2000, pp. 3172-3176.) The system described in these references is not capable of producing the patterns with required minimum size.

Another prior art system for forming patterns on surfaces of wafers was disclosed in Russian Pat. No. RU 2,180,885. It has a block for forming a matrix of oblique linear ion beams implemented as a plasma electrode with the matrix of linear apertures positioned according to the required disposition of the arrays of nanolines on the silicon surface and a precision stage for transferring of a wafer across the sheet ion beams. However this device requires a complex system for controlling and focusing ion beams.

Therefore there remains a need for effective and relatively inexpensive techniques and devices for forming highly coherent wavelike nanostructures.

SUMMARY OF THE INVENTION

An important technical result achieved by implementation of one of the preferred embodiments of the proposed technique is a substantial improvement of the coherency of a wavelike structure being formed.

This can be achieved by using gallium arsenide instead of the silicon and sputtering it with $N_2^+$-ion flux. In other words, instead of $N_2^+$-Si system, $N_2^+$-GaAs system is used. Thus, the gallium arsenide irradiation with $N_2^+$ leads to the formation of wavelike nanostructures with much higher coherency.

Preferably, layers of amorphous gallium arsenide are used. Preferably, the layers of amorphous gallium arsenide are formed by magnetron sputtering.

Preferably, the $N_2^+$-ion incidence angle is selected in the 55° to 60° range relative to the normal to the GaAs surface.

Preferably, the $N_2^+$-ion energy is selected in the 6 to 8 keV range.

Preferably, the GaAs is sputtered with $N_2^+$-ions up to a depth $D_F=1$ micron.

Preferably, to increase the amplitude of a wavelike nanostructure formed in a $N_2^+$-GaAs system, an additional sputtering is carried out with $O_2^+$ ion flux in a bombardment plane coinciding with the bombardment plane of the $N_2^+$ ions.

Preferably, the energy and the angle of bombardment with $O_2^+$ ions in the additional sputtering is selected in such a way that the wavelengths in $N_2^+$-GaAs and $O_2^+$-GaAs systems are equal.

Preferably, the amplitude growth of a wavelike nanostructure under the additional sputtering with $O_2^+$ ions is controlled by the secondary-emission signal.

Preferably, the signals of secondary electron, ion or photon emission are used as a secondary-emission signal.

Preferably, the additional irradiation with $O_2^+$ ions is carried out only until the moment when the secondary-emission signal is saturated.

Another important technical result achieved by implementing a second preferred embodiment also results in an additional improvement of the coherency of a wavelike pattern structure being formed. This can be achieved by carrying out the silicon sputtering in two stages. First, a low-amplitude wavelike nanostructure with an increased coherency at the sputtering depth $D_m$ is formed with $O_2^+$ ion flux in an $O_2^+$-Si system and subsequently a further silicon sputtering with $N_2^+$ ions in the $N_2^+$-Si system is carried out until the growth of the amplitude of a wavelike nanostructure at the sputtering depth $D_F$ is saturated. Meanwhile, the bombardment planes for $O_2^+$ and $N_2^+$ ions coincide and the energy and the angle of ion bombardment are selected in such a way that the wavelengths of the wavelike pattern structure in $O_2^+$-Si and $N_2^+$-Si are equal.

Preferably, the layers of amorphous silicon are used.

Preferably, the formation of a wavelike nanostructure is controlled by the secondary-emission signals.

Implementation of the third preferred embodiment also resulted in an improvement of the coherency of a wavelike pattern structure being formed. This can be achieved through carrying out of a preliminary directional polishing of the silicon surface. After that a wavelike pattern structure in $N_2^+$-Si system is formed so that the orientation of the wave crests coincide with the polishing direction.

Preferably, abrasives containing small particles, such as alumina, silica and chromium oxide are used for directional polishing.

An implementation of the fourth preferred embodiment results in the elimination of the system for deflection and focusing of the sheet ion beams and allows forming arrays of nanolines with a normal incidence of the sheet beams.

This can be achieved by the use of a block for forming a matrix of sheet ion beams that assures a normal incidence of beams upon the silicon surface. The device could be used for forming coherent wavelike nanostructures upon silicon surfaces with a period much smaller than the width of an ion beam. It makes the device different from the known prior art applied in ion beam projection lithography, i.e. forming the lines in the resist with a width comparable with a diameter of an ion beam. In addition, the preferred embodiments implement a matrix of the sheet beams instead of a matrix of circular beams. A precision stage can be used to transfer the wafer across the sheet of beams.

Preferably, the width of sheet ion beams is about 0.5 micron and their ion energy should be approximately equal to 5 keV.

Preferably, the precision stage transfers the wafer at a velocity determined by the following formula:

$$V=(I_L \cdot Y \cdot A)/(p \cdot D_F \cdot N_A \cdot e),$$

where $I_L$ is a linear current density of sheet ion beam, A/cm;
Y is a sputtering yield as calculated with respect to one atom of nitrogen;
A is a molecular mass of the silicon, gram;
$D_F$ is a coherent wavelike structure formation depth, cm;
$N_A$ is Avogadro's number, $6.022 \cdot 10^{23}$ moles$^{-1}$
e is the electron charge, $1.6 \cdot 10^{-19}$ C.

Preferably, a precision stage for a wafer transfers the wafer at a velocity controlled by a secondary electronic emission signal from a test cell set up on the precision stage.

An implementation of another preferred embodiment results in a novel design of a device for directed wafer polishing. This result can be achieved by implementing a wafer holder to hold a wafer in a fixed position with respect to the direction of the band movement.

DETAILED DESCRIPTION OF THE PREFERED EMBODIMENTS

Detailed descriptions of the preferred embodiments are provided herein. It is to be understood, however, that the present inventions may be embodied in various forms. Therefore, specific implementations disclosed herein are not to be interpreted as limiting.

Figure 1A:
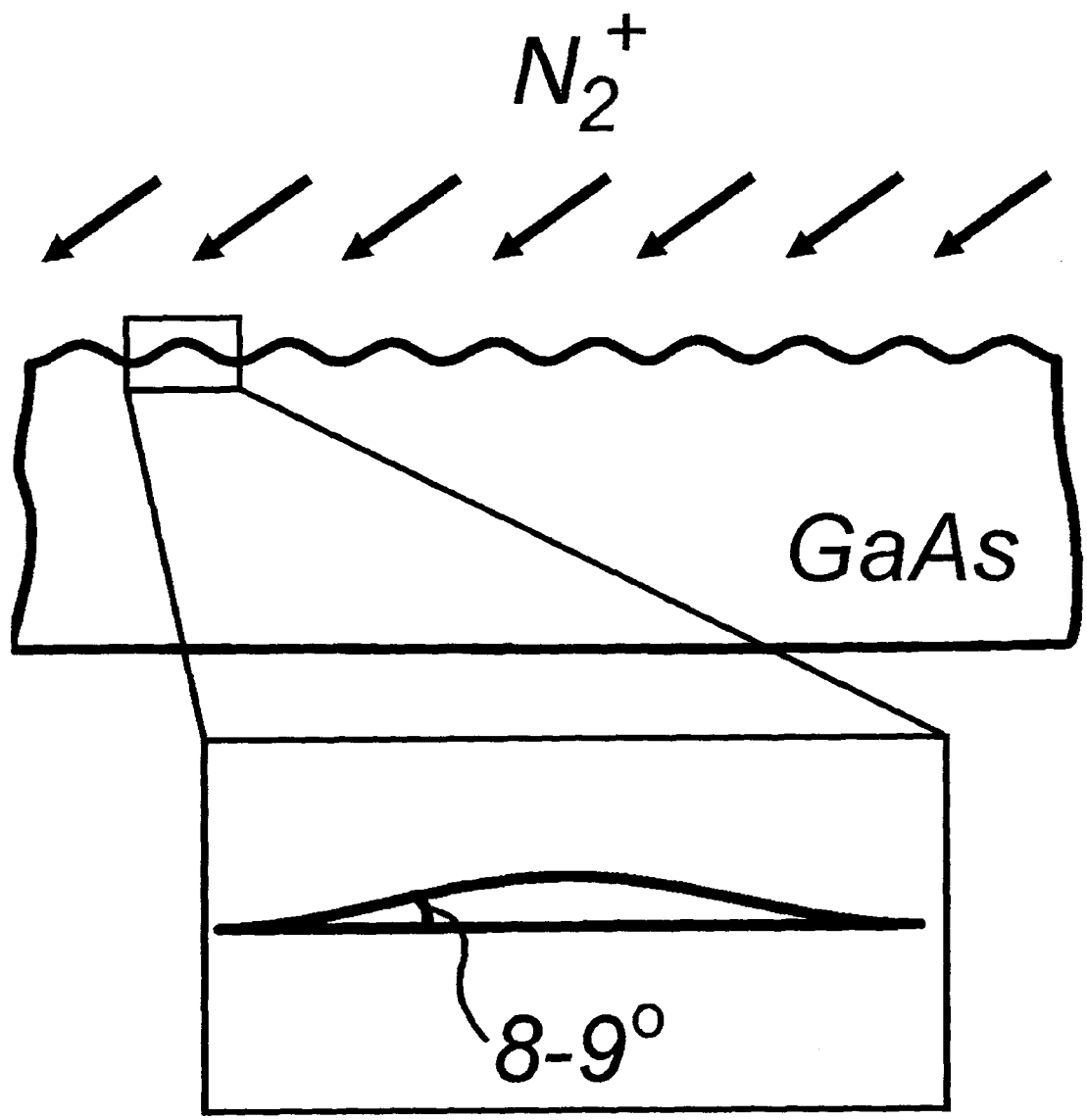
FIG. 1A schematically illustrates a process of formation of a coherent low-amplitude wavelike nanostructure upon a gallium arsenide surface by sputtering with $N_2^+$ ions and the geometry of an individual wave.

FIG. 1A schematically shows a process of forming a wavelike nanostructure in a $N_2^+$-GaAs structure. An ion beam is scanned in a raster pattern on the surface of the material to provide for a homogeneous ion flux. FIG. 1A shows a view coinciding with a plane of ion bombardment i.e. with a plane of ion incidence, the plane which is defined by a normal to the surface of the material and a vector oriented in the direction of the ion beam i.e. ion flow. For example, a highly coherent wavelike nanostructure with a wavelength of $\lambda=130$ nm is formed by choosing the angle of ion bombardment relative to the normal of a GaAs surface in the range approximately equal to $\theta=55\text{-}58°$ with the $N_2^+$ ion energy about $E=8$ keV and a sputtering depth $D_F$ of about 1 micron. This nanostructure has almost no wave abruptions and a very small number of wave intersections. The wave crests are oriented perpendicular to a plane of ion bombardment. With an increase of the irradiation dose, up to a sputtering depth of 35 micron the nanostructure does not undergo any significant transformations. Observation through a scanning electron microscope (SEM) of a GaAs crystal sample with a wavelike nanostructure obtained at E=8 keV and θ=56° allowed observation of the geometry of an individual wave. The wave amplitude was 13 nm at λ=130 nm. The wave's slopes were inclined by 8-9° relative to the horizontal direction. Consequently, the local angles of bombardment of waves slopes are equal to 47° and 65° and protracted sputtering does not alter these angles.

In this particular $N_2^+$-GaAs system a wavelike nanostructure observed through a SEM is not formed at angles θ>60° (E=8 keV) as well as at the ion energy E<6 keV and θ=56°. However, at E=6 keV and θ=56° a wavelike nanostructure with λ=123 nm is formed. In the absence of a wavelike nanostructure at θ>60°, solitary cone-shaped formations are observed at the bottom and the slopes of a crater formed by ion sputtering. At E=8 keV in the angles range of θ=45-55°, a low-coherent, low-amplitude periodic nanostructure is formed. It undergoes a progressing perturbation when the dose of ion irradiation is increased. A similar progressing perturbation is also typical for $O_2^+$-GaAs and $O_2^+$-Si systems.

No influence of a process of forming a wavelike nanostructure upon an emission of Auger-electrons was detected; consequently, in situ registration of this process was not made possible.

Through SEM observation of a surface of the ion beam etched craters formed by $N_2^+$ ions at a GaAs surface at E=8 keV and θ=55° and at various irradiation doses, a depth of the wavelike nanostructure formation of 1 micron was ascertained.

Figure 1B:
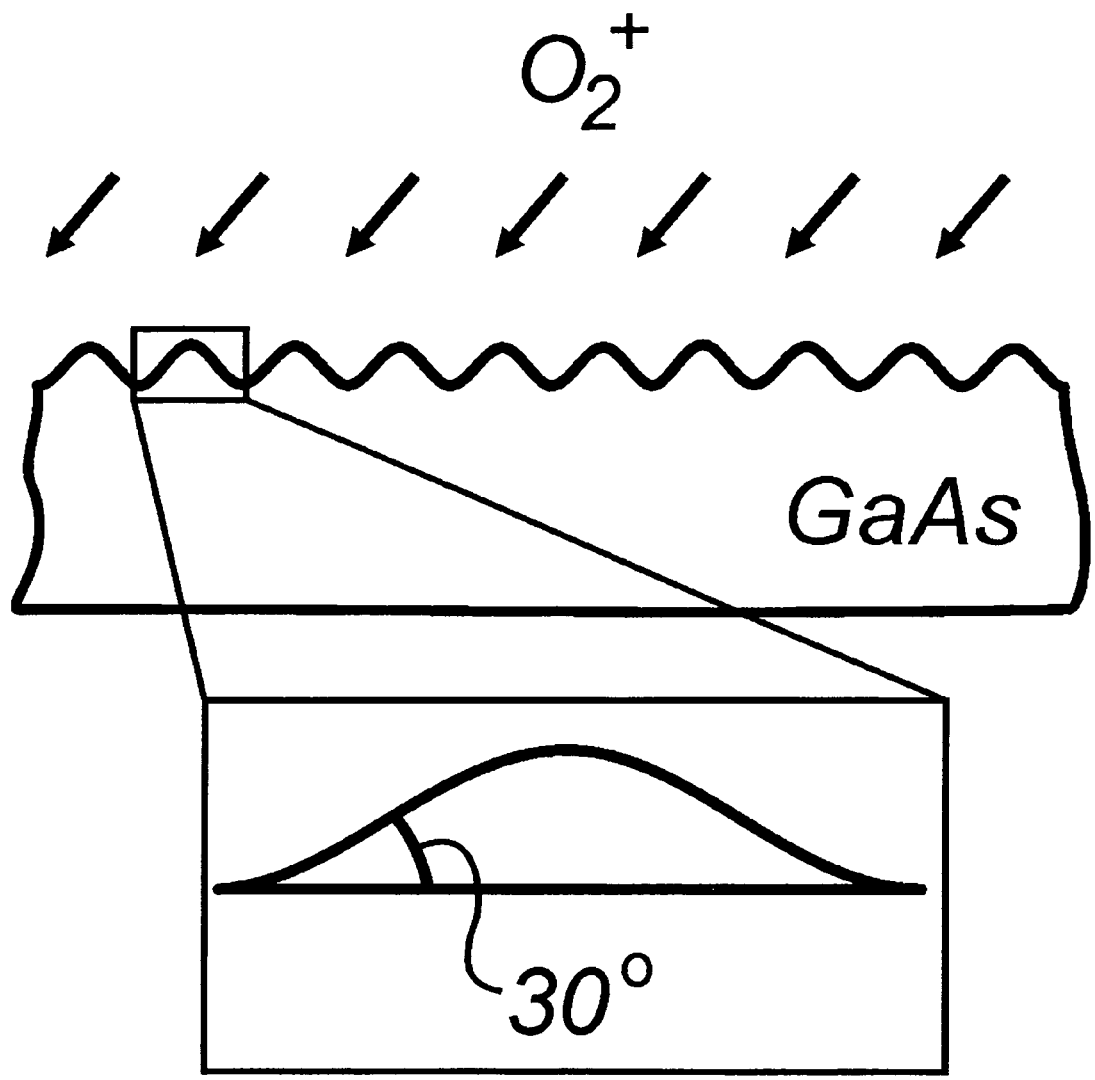
FIG. 1B schematically illustrates the process of formation of a coherent wavelike nanostructure upon a gallium arsenide surface with increased amplitude resulting from additional sputtering with $O_2^+$ ions and the geometry of an individual wave.

For the purpose of increasing the amplitude of the wavelike nanostructure formed in $N_2^+$-GaAs system and for increasing a tilt angle of the wave slopes, experiments with a two-stage formation of a wavelike nanostructure were carried out. At the first stage, a wavelike nanostructure with λ=128 nm at a sputtering depth of 1.5 micron under the conditions of E=8 keV and θ=56.7° was formed in a $N_2^+$-GaAs system. These conditions provided for maximum coherency of the nanostructure. Thereupon, a sputtering of this wavelike nanostructure was performed with $O_2^+$ ions under the conditions of E=5.5 keV and θ=39° with various ion irradiation doses. The process of an additional sputtering of a wavelike nanostructure is illustrated in FIG. 1B. The bombardment planes of $O_2^+$ and $N_2^+$ ions were coincident. A dose of irradiation with $O_2^+$ ions was selected based on the time during which a secondary-emission signal of $GaO^+$ ions reached a saturation point. This growth and saturation of the emission signal reflects the growth and saturation of a tilt angle of the wave slopes of a nanostructure. This relationship was also observed with $As^+$ or $AsO^+$ secondary ions in the $O_2^+$-GaAs system.

Figure 1C:
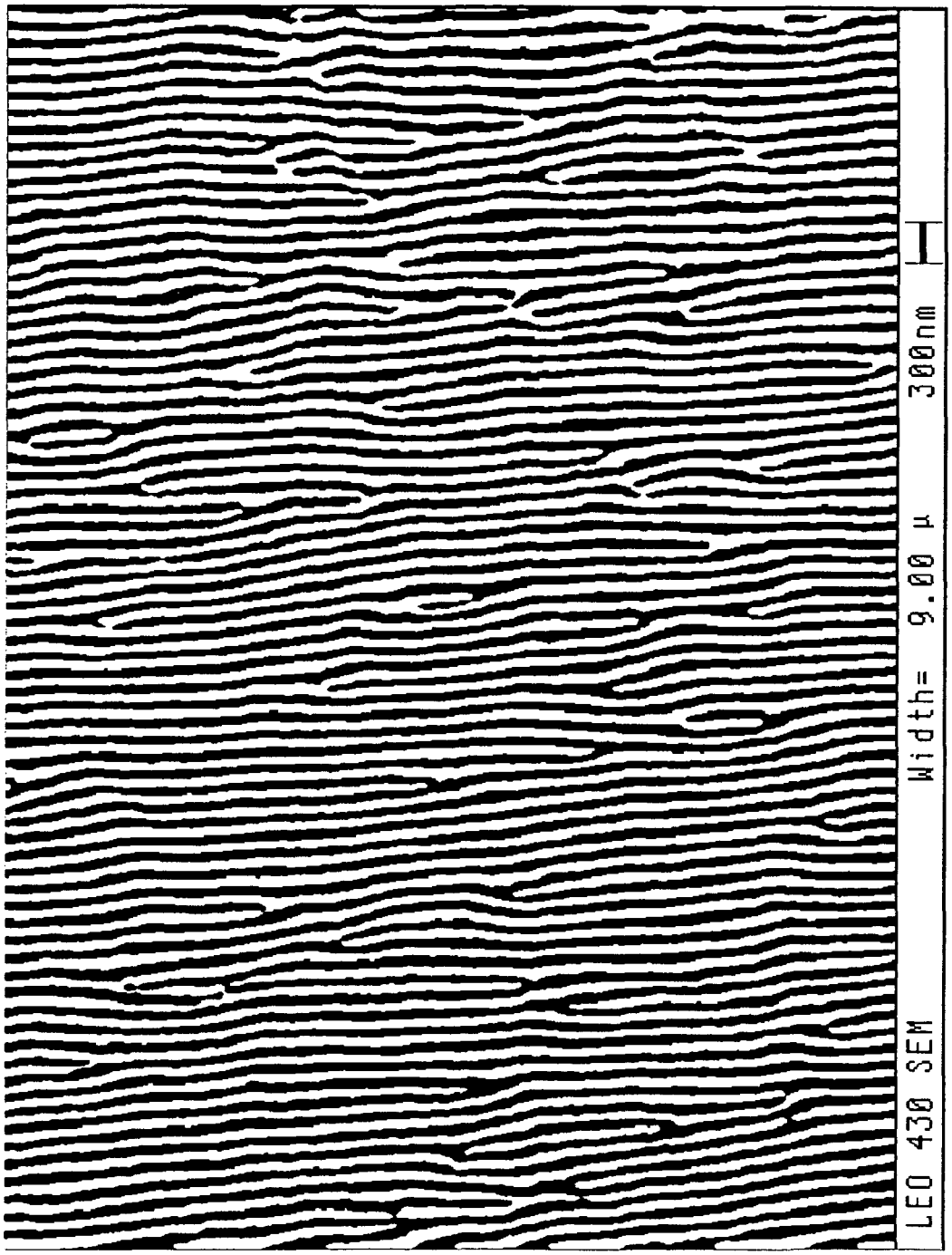
FIG. 1C shows a SEM-image of a coherent nanostructure formed in $N_2^+$-GaAs with a subsequent additional sputtering with $O_2^+$ ions.
Figure 1D:
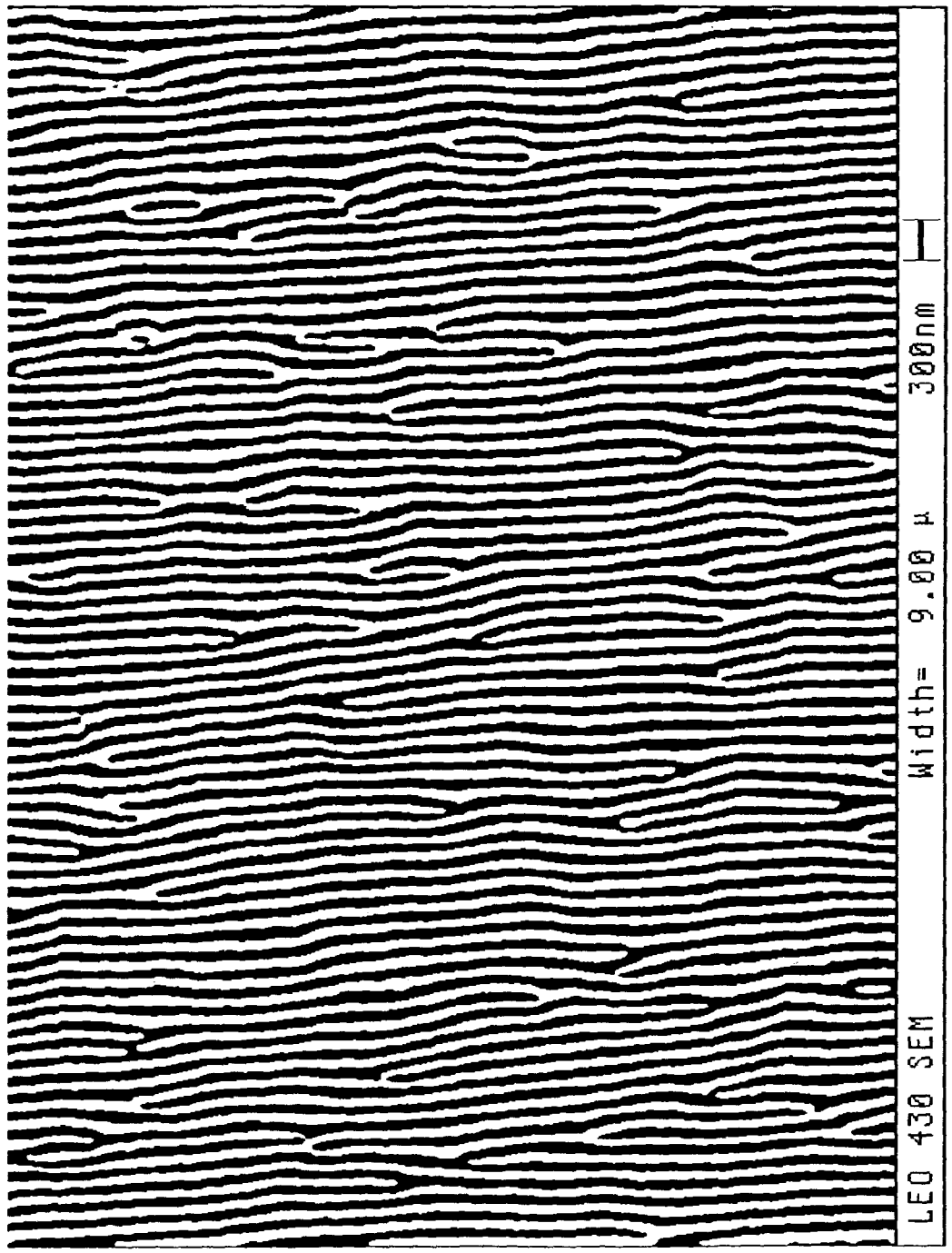
FIG. 1D shows a SEM-image of a coherent nanostructure formed in $N_2^+$-GaAs with a subsequent additional sputtering with $O_2^+$ ions.

In these experiments the growth of the $GaO^+$ emission signal reached saturation within 4 minutes. FIGS. 1C and 1D show SEM-images of wavelike nanostructures with λ=123 nm formed as a result of a two-study process with a consequent sputtering with $O_2^+$ ions for a period of 1.5 and 2.5 minutes accordingly. The contrast amplification of a SEM-image in a secondary electron emission with the increase of $O_2^+$ ion irradiation dose indicates an increase of a tilt angle of the wave slopes. The comparison of FIGS. 1C and 1D shows that an increase of a dose of irradiation with $O_2^+$ ions does not significantly influence the ordering of an initial wavelike nanostructure obtained in the $N_2^+$-GaAs system.

For certain applications it is preferable to form layers of amorphous GaAs on surfaces of various materials by means of GaAs target magnetron sputtering.

SEM observations of an evolution of the morphology of the ripples shows that it is possible to achieve higher coherency of the waves at a sputtering depth $D_m$. As compared to the $N_2^+$-Si system, in the $O_2^+$-Si system wavelike nanostructures formed at depths of $D_m$ have considerably fewer wave abruptions.

Figure 2A:
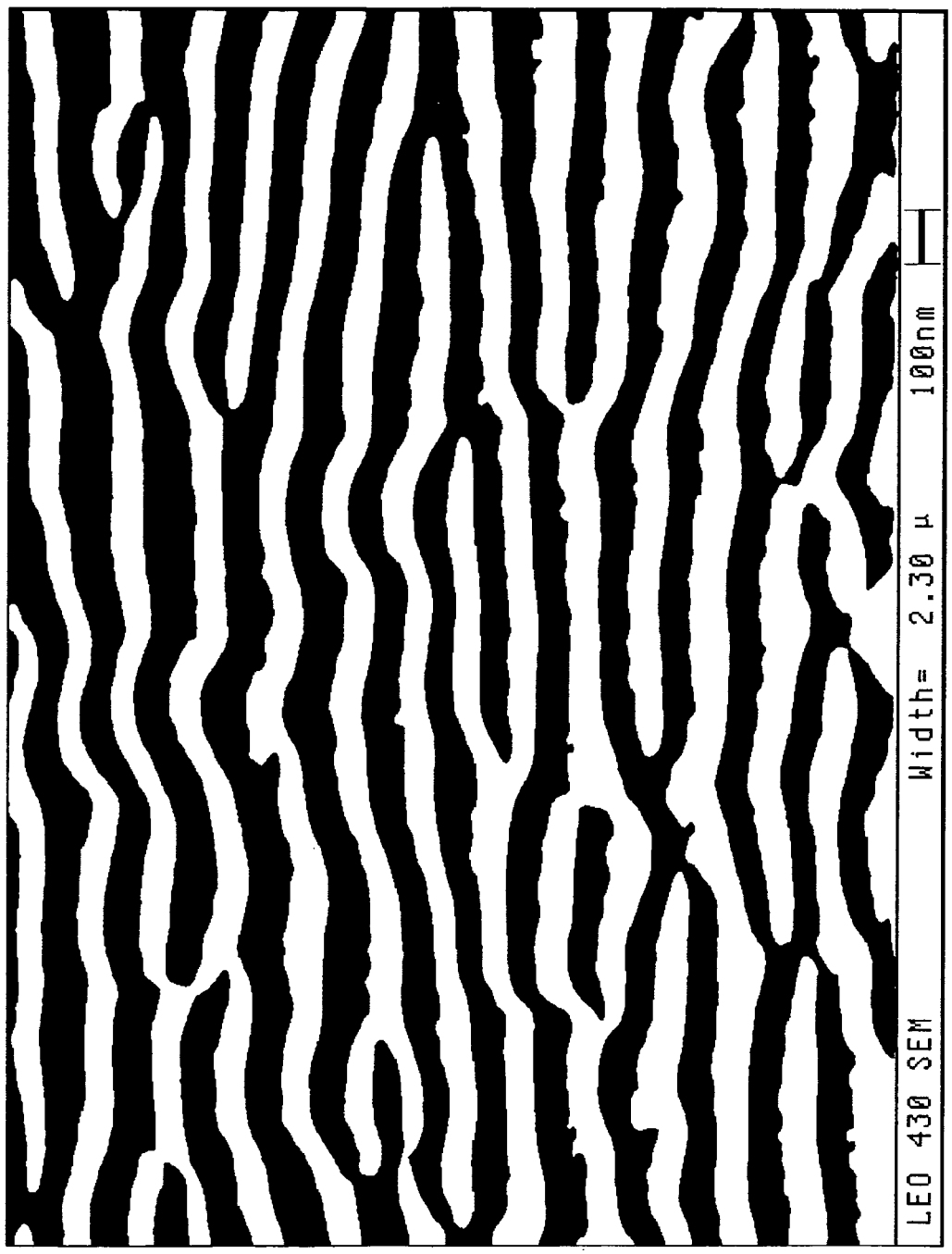
FIG. 2A shows a SEM-image of a wavelike nanostructure formed in a $N_2^+$-Si system.
Figure 2B:
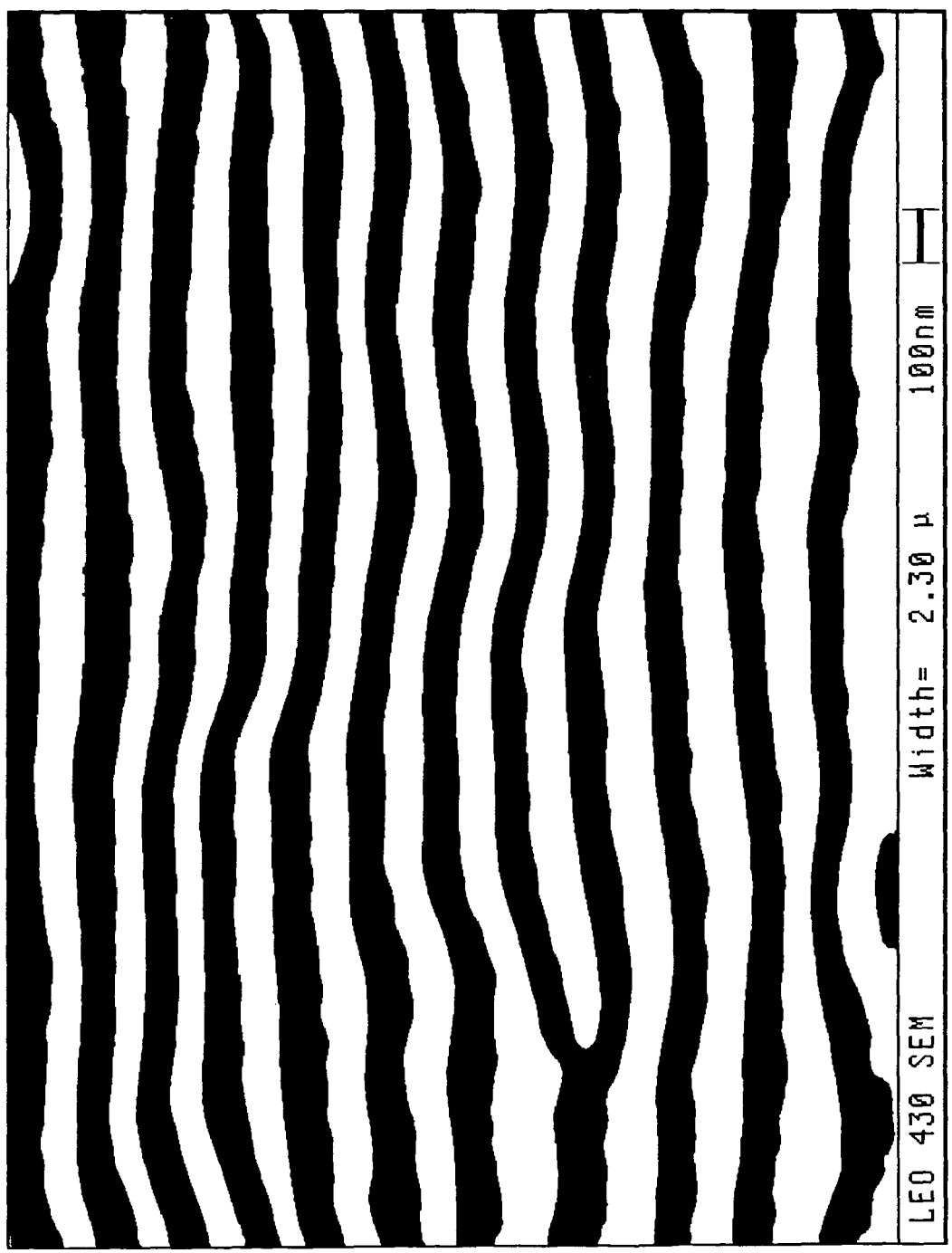
FIG. 2B shows a SEM-image of a wavelike nanostructure formed in an $O_2^+$-Si system at a depth $D_m$ after a subsequent additional sputtering with $N_2^+$ ions.
Figure 3A:
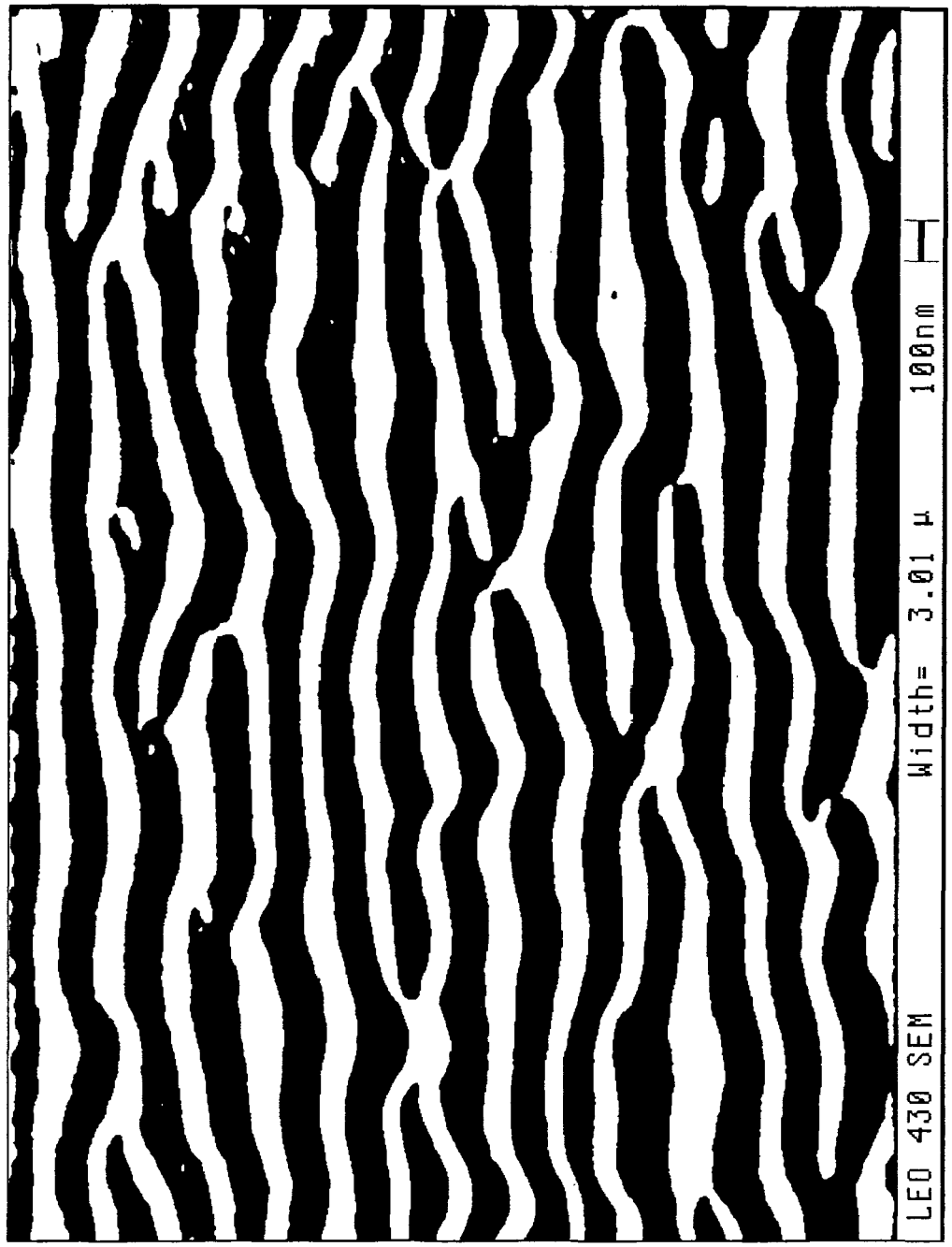
FIG. 3A shows a SEM-image of a wavelike nanostructure formed in a $N_2^+$-Si system.
Figure 3B:
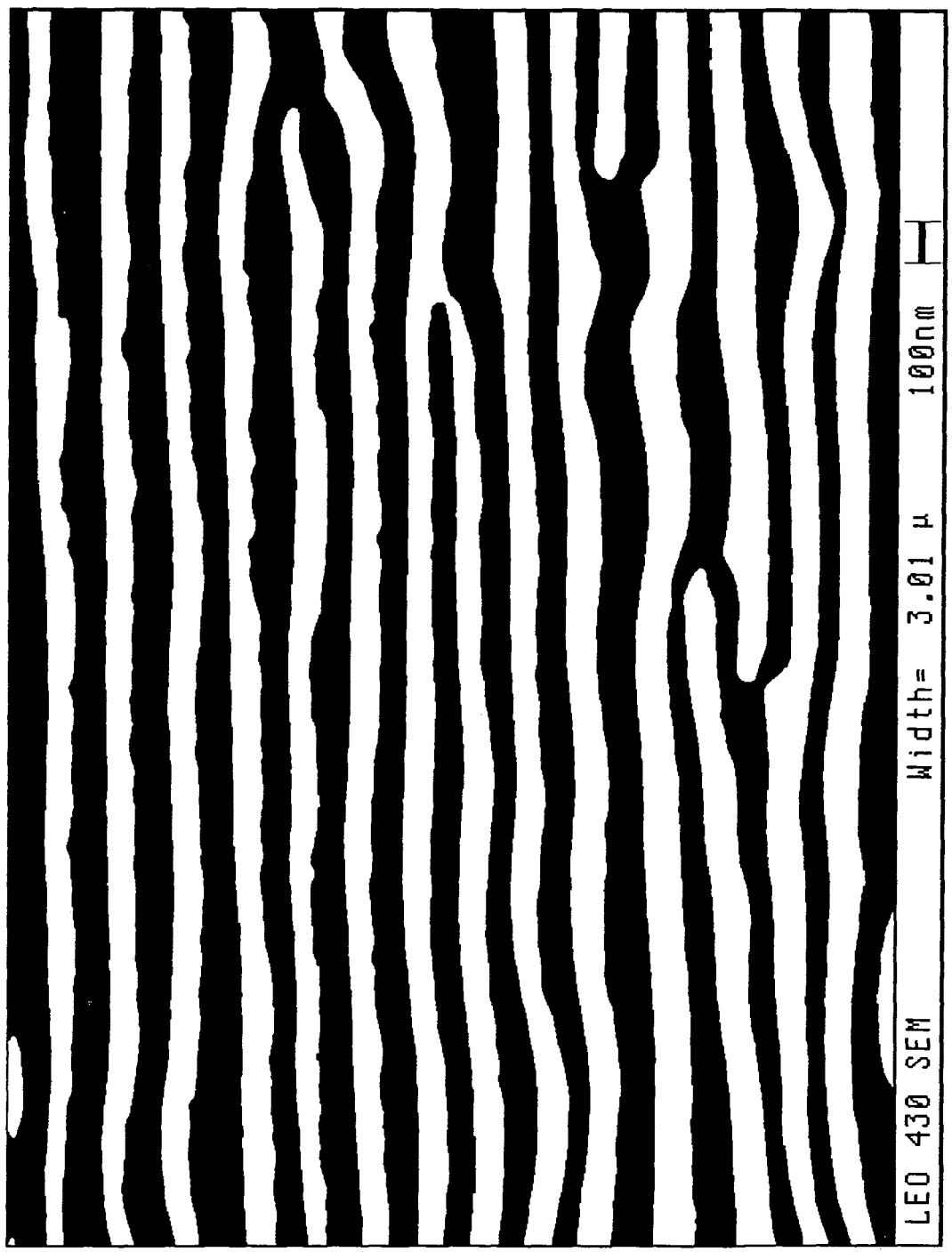
FIG. 3B shows a SEM-image of a wavelike nanostructure formed in $N_2^+$-Si system with preliminary directed surface polishing with the GOI paste.

These considerations suggest a method for forming highly coherent wavelike nanostructures based on a two-stage formation process. In one preferred embodiment, at the first stage, in the $O_2^+$-Si system, a wavelike nanostructure was formed with λ=130 nm at E=4 keV and θ=47° at a sputtering depth $D_m$=1350 nm. The parameters for the second stage were selected to achieve equal wavelengths in the $O_2^+$-Si and the $N_2^+$-Si systems. At the second stage, the wavelike nanostructure was sputtered with $N_2^+$ ions at E=8 keV and θ=43° up to a final depth D=1670 nm. The depth of the additional sputtering in the $N_2^+$-Si system is equal to 320 nm and shows the conditions for the second stage of forming the wavelike nanostructure. The bombardment planes for $O_2^+$ and $N_2^+$ ions coincided. The two-stage process resulted in a wavelike nanostructure with λ=140 nm shown in FIG. 2B. For comparison purposes, FIG. 2A shows the image of a wavelike nanostructure formed in the one-stage process in $N_2^+$-Si system at E=8 keV and θ=43°. A statistical analysis of SEM-images with a size of 6.77×9 micron² was carried out by counting the number of waves in the 1.3 by 6.5 micron² frames oriented by a long side perpendicular to the wave's crests and each containing 50 waves. The number of the waves passing from one long edge of the frame to the other without abruptions and intersections (a quantity of good waves), the number of waves crossing one of the edges but not reaching the other edge (a quantity of the wave abruptions) and the number of waves intersecting inside the frame were counted. The results showed that a two-stage process of forming a $N_2^{+-[O_2^+}$-Si] wavelike nanostructure decreases the number of wave abruptions by 5.4 times, the wave intersections by 2.9 times, and increases the quantity of good waves by 2.4 times. Thus, a method for forming a wavelike nanostructure using a two-stage process with improved wave ordering was developed. The nanostructures produced by this method combine increased wave longitude as in $O_2^+$-Si system at a sputtering depth $D_m$ and planarity of the $N_2^+$-Si system.

In the $N_2^+$-Si system that does not possess a natural ordering (high coherency) property, the degree of coherency of a wavelike nanostructure can be increased by a preliminary mechanical processing of the silicon surface.

In one preferred embodiment, an oriented polishing (polishing the surface in one preferred direction) of the silicon surface with a GOI paste containing $Cr_2O_3$ particles was used as a preliminary step before the formation of a wavelike nanostructure in the $N_2^+$-Si system. The $N_2^+$ ion flux was oriented perpendicularly to the direction of movement of abrasive particles relative to the silicon surface. The results proved that the introduction of the preliminary oriented polishing step leads to a considerable increase in a degree of orientation of the nanostructure along the polishing direction. The parameters for forming the nanostructure (E=8 keV, θ=43°, $D_F$=360 nm, λ=150 nm) are close to those used without polishing. Analogous results showing an improvement of the nanostructure orientation as a result of the preliminary polishing with a GOI paste were obtained for the layers of amorphous silicon. It has also been demonstrated that a variety of water based or alkaline slurries containing small particles (such as alumina, silica, or chromium oxide) can be used for preliminary polishing instead of a GOI paste. This class of slurry systems is already used in a different industrial polishing application of the wafers in semiconductor manufacturing.

Figure 4A:
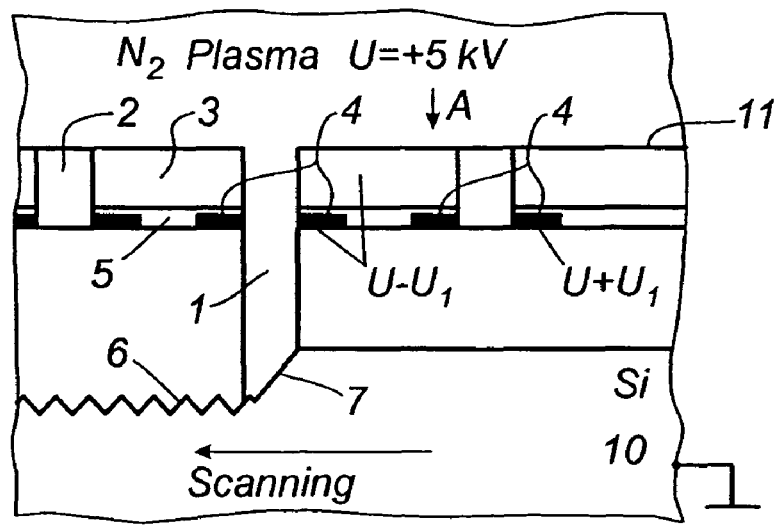
FIG. 4A schematically illustrates a cross-section of a block for forming a matrix of sheet beams.
Figure 4B:
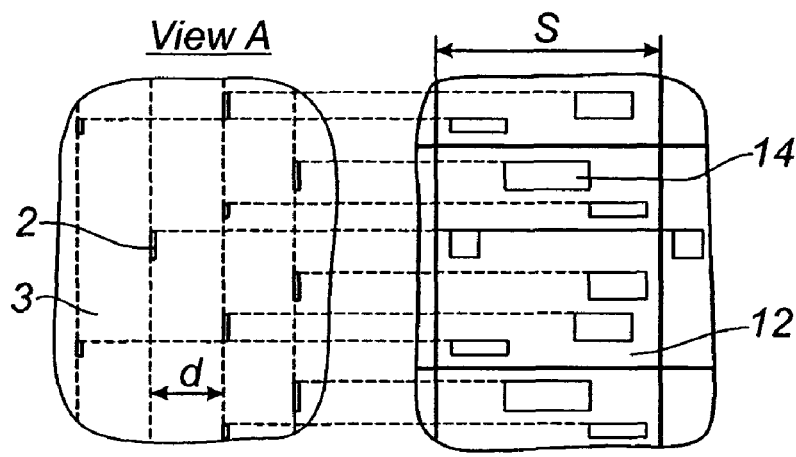
FIG. 4B schematically illustrates a view from above of a plasma electrode.
Figure 4C:
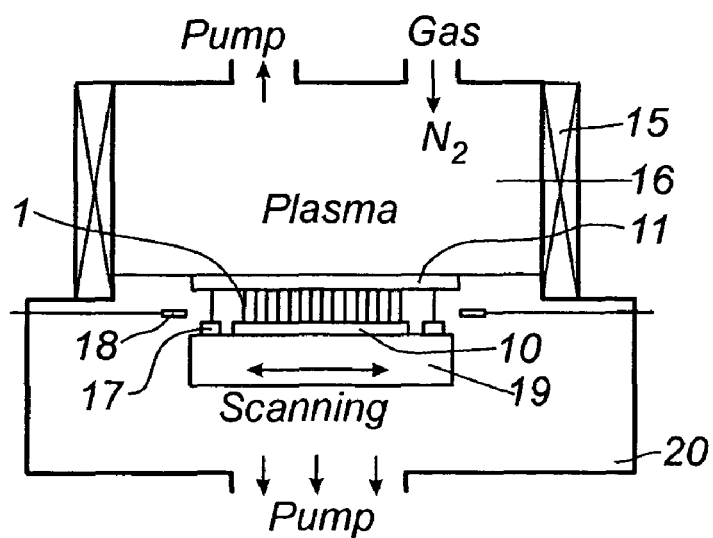
FIG. 4C schematically illustrates a device for forming coherent wavelike nanostructures.

An additional preferred embodiment relates to a novel device for forming highly coherent wavelike nanostructures. The principle of operation of this device is illustrated by FIGS. 4A-4C. FIG. 4A shows a block for forming a matrix of sheet beams. The block comprises a matrix of linear apertures 2 in a plasma electrode 3, electrodes 4 for switching on and switching off the sheet beams and insulators 5. A nanostructure 6 is formed upon the silicon wafer 10 with an ion beam 1.

FIG. 4B shows a view from above a plasma electrode 3 (view A), with crystal 12 and arrays of nanolines 14.

FIG. 4C shows a device for forming coherent wavelike nanostructures on the surface of a material comprising a block 11 for forming a matrix of sheet beams, magnets 15, a plasma chamber 16 with a system of the nitrogen discharge and exhaustion (not shown on the drawing), testing cells 17, a secondary electrode detector 18, a precision stage 19 for a wafer 10, a vacuum chamber 20 with a system of exhaust and introduction of the wafer into a chamber (not shown on the drawing), a silicon wafer 10, and a computer with interface (not shown on the drawing).

The device operates as follows. A wafer 10 is installed at a precision stage 19. A vacuum chamber is pumped to an operational pressure. Nitrogen is supplied through a discharge system into a plasma chamber for obtaining the nitrogen ion flux. A charge is ignited in a plasma chamber. The plasmas operational potential relative to the ground is approximately U=+5 keV, therefore, the chamber 16 should be properly electronically insulated from chamber 20. A plasma electrode 3 has potential U+U1, electrodes 4 have potential U−U1 when the beams are switch-on and potential U+U1 when the beams are switched-off. The electrodes 4 are insulated from the electrode 3 by an insulator 5. Potential U1 is on the order of +100V. The movement of the precision stage 19 is controlled by a computer and interface and by the secondary electron signal detector from a test cell 17. Velocity of the stage movement is decreased proportionately to the current of the secondary electron emission registered by a detector 18 from a test cell 17. A production rate of 6 wafers per hour, when the wafer is 100% covered with nanolines, can be achieved under the following conditions: the density of ion current in plasma is 250 mA/cm$^2$, the velocity of the wafer movement is 2.5 micron/s and the distance between the sheet beams is 1 mm.

The linear apertures 2 in the plasma electrode 3 are carried out along the rows with a period d being a whole number of times less than size S of the crystal 12 on the wafer 10. This allows to completely cover the crystal with arrays of nanolines 14 while moving over a distance, which is S/d times less than crystal size. The plasma electrode is made of a highly alloyed silicon wafer of n-type conductivity and of about 20 micron thickness. A part of a block forming the matrix of linear beams 11, containing electrodes 3 and 4 can be made using the planar silicon technology with the insulators 5 made from silicon nitride. The part 11, facing the wafer 10, can be covered with a layer of amorphous silicon or a low-conductivity carbon.

In all the previously disclosed embodiments, the ion flux falls obliquely upon the wafers. However, these are homogeneous ion fluxes. In case of a running sheet ion beam, as shown in FIG. 4A, an area of the sputtered surface 7 is inclined towards the ion flux direction. As it progresses along the silicon surface 10, the beam 1 sputters silicon and leaves behind an ordered nanostructure 6. The surface level with a nanostructure is lower than the level of the initial surface. The width of the obliquely sputtered area of the surface 7 is equal to the width of the beam 1. Therefore, while the ion flux 1 falls normally upon the initial surface 10, the process of forming a nanostructure 6 is carried out by tilt bombardment of the surface of the area being sputtered.

An additional study of the properties of the $N_2^+$-Si system lead to a conclusion that a preliminary directional polishing of the silicon surface in a direction of the wave crests of a wavelike structure formed thereupon considerably increases a degree of the pattern orientation, i.e. its coherency.

An example of a device for wafer polishing used in semiconductor manufacturing is disclosed in the US Pat. Application No. 2002/0142704. This device comprises a wafer holder for a wafer rotation around its axis, a constantly running band held by a support in a place where the wafer surface contacts with the band, motors for enabling the wafer holder rotation and the band movement, devices for supplying a polishing mixture onto the band, and devices for supplying air through the system of apertures to enable the band support and even distribution of the wafer pressure on to the band. However, this device is not designed to be used for directional polishing.

Figure 5:
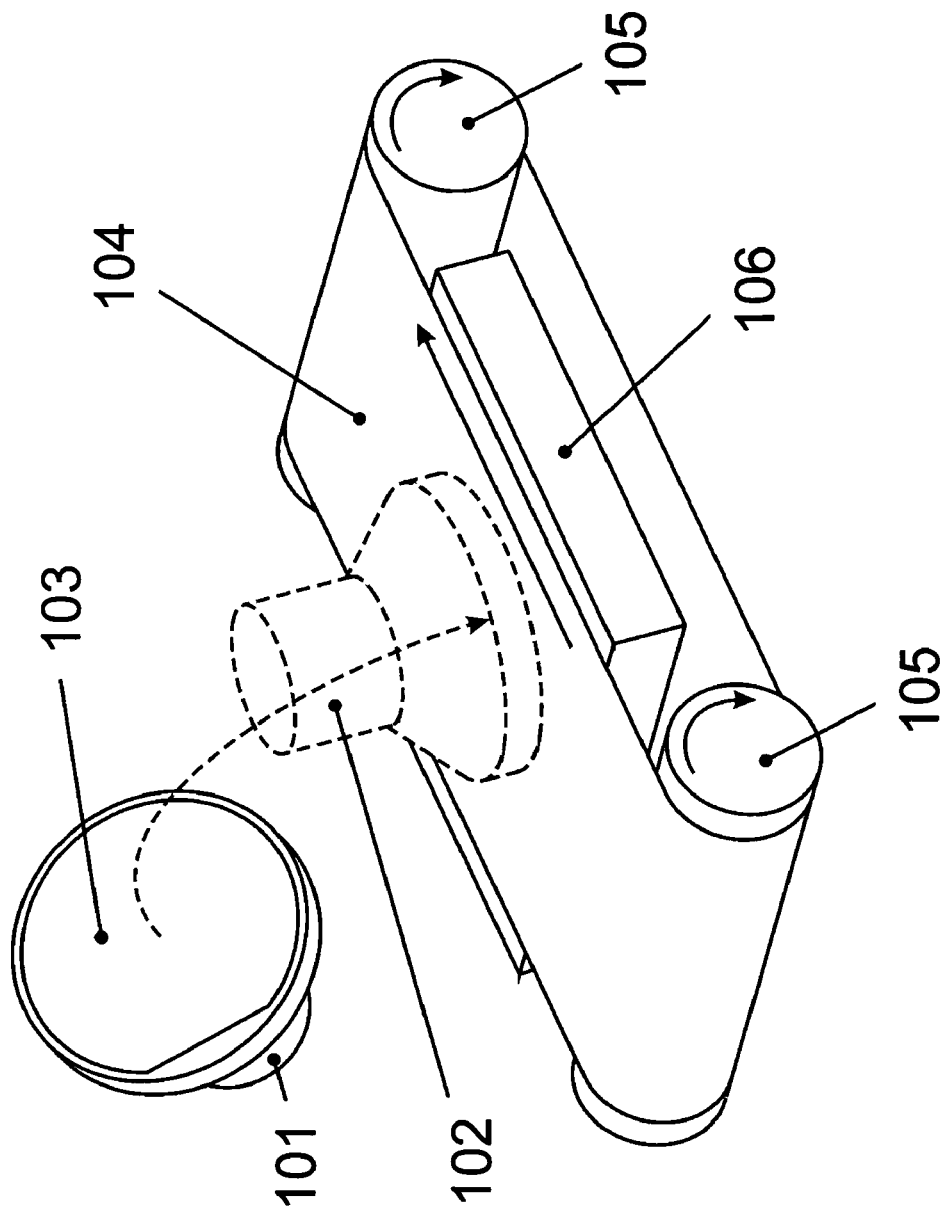
FIG. 5 schematically illustrates a device for directed polishing.

An additional preferred embodiment is a device which is effective for implementation of the oriented polishing step. Devices for chemical-mechanical polishing are widely used for polishing wafers in semiconductor manufacturing and some contain a continuously running belt (see for example an application for U.S. Patent Application Publication No. 2002/0142704). The primary purpose of these devices is to reduce the thickness of the substrate without providing an orientation to the polishing. A device for oriented polishing can be manufactured by implementing the following changes in a previously known design: eliminating rotation of the wafer holder around its axis and securing the holder in the necessary position relative to a direction of the running band. FIG. 5 shows a device for directional wafer polishing. It consists of a wafer holder 101, shown in an inoperative position. The holder is used for wafer installation. In an operative position 102, the holder presses the wafer 103 to a continuous band 104, set in motion by rolls 105. The wafer holder provides for a fixed position of the wafer 103 relative to a direction of the band 104. A support 106 keeps the band 104 and the wafer holder in the operative position. The support has a system of apertures to let the compressed air flow through, thus providing for an even distribution of the pressure of the wafer on to the band. In addition, a polishing slurry is supplied onto the band (FIG. 5 does not show a device for supplying slurry). The rolls 105 and a lower part of the band 104 can be submerged into a polishing slurry bath. A selection of an appropriate abrasive for the polishing slurry, (for example, silica or alumina are widely used for polishing in semiconductor manufacturing), may help to achieve maximum coherence of a wavelike nanostructure after a subsequent ion sputtering step.

The invention can be used for forming patterns on the surface of the silicon and the gallium arsenide with the lines width of 10 to 60 nm. It also can be used in for forming nanowires for nanoelectronics and optoelectronics devices.

What is claimed is:

1. A method of forming a substantially coherent wavelike nanostructures comprising:
    irradiating a surface of a semiconductor material with a flow of nitrogen ions to form substantially periodic wavelike nanostructures at a first depth, said wavelike nanostructures having wave crests which are substantially perpendicular to a plane of incidence of the nitrogen ions;
    irradiating said wavelike nanostructures with a flow of oxygen ions, wherein the flow of oxygen ions is in a plane which substantially coincides with the plane of incidence of the nitrogen ions to create new substantially periodic wavelike nanostructures at a depth greater than the first depth.

2. The method of claim 1 wherein the semiconductor material is gallium arsenide.

3. The method of claim 1 wherein the semiconductor material is amorphous gallium arsenide.

4. The method of claim 3 wherein the flow of oxygen ions has energy and angle of ion incidence selected such that wavelengths of wavelike nanostructures that would have been formed by irradiation the surface only by the flow of oxygen ions alone are substantially the same as wavelengths of the wavelike nanostructures produced by the step of irradiating with nitrogen ions.

5. The method of claim 3 further comprising depositing amorphous gallium arsenide using magnetron sputtering.

6. The method of claim 3 wherein the flow of nitrogen ions intersects a normal to the surface of the material at an angle in the range of 55 to 60 degrees.

7. The method of claim 6 wherein the flow of nitrogen ions has energy in the range of 6 to 8 keV.

8. The method of claim 7 wherein the gallium arsenide semiconductor material is sputtered with nitrogen ions and wherein a layer of the gallium arsenide sputtered with nitrogen ions does not exceed 1 micron.

9. The method of claim 3 further comprising controlling growth of amplitude of the wavelike nanostructures by using a secondary-emission signal.

10. The method of claim 9 wherein the secondary-emission signal comprises electron, ion, or photon emission.

11. The method of claim 10 wherein the step of irradiating with oxygen ions is performed until the secondary-emission signal is saturated.

12. A method of forming substantially coherent wavelike nanostructures comprising:
   irradiating a surface of a semiconductor material with a flow of oxygen ions until low-amplitude wavelike nanostructures are formed; and
   subsequently irradiating the surface with a flow of nitrogen ions, wherein a plane of incidence of nitrogen ions substantially coincides with a plane of incidence of the oxygen ions.

13. The method of claim 12 wherein nitrogen ions and oxygen ions have respective energies and angles of ion incidence with respect to the surface of the material so as to produce wavelike nanostructures having substantially the same wavelengths.

14. The method of claim 12 wherein the semiconductor material is amorphous silicon.

15. The method of claim 14 further comprising controlling the duration of irradiating with a flow of oxygen ions using secondary-emission signals.

16. The method of claim 15 further comprising controlling the saturation of the amplitude of the wavelike nanostructures, during the step of irradiating with a flow of nitrogen, with secondary-emission signals.

17. A method of forming coherent wavelike nanostructures on a surface of a semiconductor material comprising:
   inducing a substantially uniform stress in a surface layer of the semiconductor material, wherein said stress is substantially oriented in a first direction,
   irradiating the surface of the semiconductor material with a flow of ions until substantially periodic wavelike nanostructures are formed on the surface of the material, said wavelike nanostructures having wave crests oriented substantially in the first direction.

18. The method of claim 17 wherein the inducing step comprises polishing said surface layer in the first direction.

19. The method of claim 17 wherein the semiconductor material is chosen from the group consisting of silicon, amorphous silicon, gallium arsenide and amorphous gallium arsenide.

20. The method of claim 17 wherein the ions are oxygen ions.

21. The method of claim 17 wherein the ions are nitrogen ions.

22. The method of claim 21 wherein the flow of nitrogen ions is substantially homogeneous.

23. The method of claim 17 wherein said wavelike nanostructures have wave crests which are substantially perpendicular to a plane of ion incidence.

24. The method of claim 21 further comprising irradiating the surface of the semiconductor material, having wavelike nanostructures created in the step of irradiating with a flow of nitrogen ions, with a flow of oxygen ions, wherein the flow of oxygen ions is in a plane which substantially coincides with the plane of incidence of the nitrogen ions.

25. The method of claim 24 wherein the flows of nitrogen ions and oxygen ions have respective energies and angles of ion incidence with respect to the surface of the material so as to produce wavelike nanostructures having substantially the same wavelengths.

26. The method of claim 18 wherein the step of polishing is performed using abrasives chosen from a group consisting of small particles, such as alumina, silica and chromium oxide.

27. A method of forming coherent wavelike nanostructures on a surface of a semiconductor material comprising:
   polishing the surface of the semiconductor material in a first direction,
   irradiating the surface of the semiconductor material with a flow of oxygen ions until low-amplitude wavelike nanostructures are formed, said wavelike nanostructures having wave crests oriented in substantially the first direction;
   subsequently irradiating the surface, having low-amplitude wavelike nanostructures, with a flow of nitrogen ions until an amplitude of the wavelike nanostructures is saturated.

28. The method of claim 27 wherein the semiconductor material is silicon.

29. The method of claim 27 wherein nitrogen ions and oxygen ions have respective energies and angles of incidence with respect to the surface of the material so as to produce wavelike nanostructures having substantially the same wavelengths.

30. The method of claim 28 wherein the step of polishing is performed using abrasives comprising particles such as alumina, silica or chromium oxide.

31. The method of claim 30 wherein the sizes of the particles are less than a wavelength of a wavelike nanostructure.

32. A method of forming coherent wavelike nanostructures on a surface of a material comprising:
   irradiating the surface of the material with an ion beam provided through an elongated aperture in a direction substantially perpendicular to the surface so as to form an elongated groove on the surface of the material, said groove oriented parallel to a longer side of said elongated aperture and having two elongated tilted walls extending from a surface edge to a bottom of the groove with a tilt angle between the walls and a normal to the surface in the range of 37-60 degrees;
   subsequently moving the material in a direction perpendicular to the elongated side of the grove and the normal to the surface; and
   removing the material from a one of the tilted walls and expanding the groove in the direction opposite of the direction of the material movement by irradiating said wall with said ion sheet beam to form the wavelike nanostructures on the bottom surface of the groove.

33. The method of claim 32 wherein in the removing step the depth of the groove remains substantially constant.

34. The method of the claim 32 wherein in the removing step the tilt angle between the irradiated tilted wall and the normal to the surface remains substantially constant.

35. The method of the claim 32 wherein the ion energy remains substantially constant.

36. The method of the claim 32 wherein the ion beam comprises nitrogen ions.

37. The method of the claim 36 wherein the depth of the groove and the tilt angle remain substantially constant and the ion energy is in the range of 0.9 and 10 keV.

38. The method of claim 32 wherein the semiconductor material is gallium arsenide or amorphous gallium arsenide.

39. The method of claim 32 wherein the semiconductor material is silicon or amorphous silicon.

40. The method of claim 32, wherein the elongated aperture is one of a plurality of such elongated apertures used to simultaneously create a plurality of wavelike nanostructures in said material.

* * * * *